United States Patent [19]

Ternullo, Jr.

[11] Patent Number: 6,111,447
[45] Date of Patent: Aug. 29, 2000

[54] TIMING CIRCUIT THAT SELECTIVELY TRIGGERS ON A RISING OR FALLING INPUT SIGNAL EDGE

[75] Inventor: Luigi Ternullo, Jr., San Jose, Calif.

[73] Assignee: Vanguard International Semiconductor Corp., Hsinchu, Taiwan

[21] Appl. No.: 09/071,601

[22] Filed: May 1, 1998

[51] Int. Cl.[7] ...................................................... G06F 1/04
[52] U.S. Cl. ........................... 327/292; 327/176; 327/165; 327/398
[58] Field of Search ..................................... 327/172, 173, 327/174, 175, 176, 263, 285, 393, 395, 398, 165, 292

[56] References Cited

U.S. PATENT DOCUMENTS

| | | | |
|---|---|---|---|
| 4,757,214 | 7/1988 | Kobayashi | 327/263 |
| 5,261,081 | 11/1993 | White et al. | 395/550 |
| 5,359,232 | 10/1994 | Eitrheim et al. | 307/268 |
| 5,430,461 | 7/1995 | Tsai | 345/100 |
| 5,682,113 | 10/1997 | Park et al. | 327/176 |
| 5,812,000 | 9/1998 | Kobayashi et al. | 327/176 |

*Primary Examiner*—Jung Ho Kim
*Attorney, Agent, or Firm*—Jiawei Huang; J. C. Patents

[57] ABSTRACT

A timing circuit can be selectively configured to generate output pulses in response to either the falling edges or the rising edges of an input signal. The timing circuit includes a multiplexer, an output pulse width controller (OPWC), a gating circuit (GC) and a latch circuit. The OPWC includes a delay circuit that can be configured to provide a predetermined delay $\delta$ that can be larger than the pulse width of the input signal pulses. The multiplexer is connected to receive a first input signal and an inverted version of a second input signal. The first input signal is used in a rising edge triggered mode, whereas the second input signal is used in a falling edge triggered mode. The multiplexer receives a mode signal to selectively output one of the input signals to the GC. The GC is also connected to receive the output signal from the OPWC. The OPWC is configured in conjunction with the selected signal from the multiplexer, to cause the GC and the latch circuit to generate output pulses having a predetermined pulse width equal to $\delta$, triggered by the rising edges of the selected signal. Because the second input signal is inverted, during the second mode the output pulses are in effect triggered by the falling edges of the second input signal.

20 Claims, 7 Drawing Sheets

TIMING CIRCUIT THAT SELECTIVELY TRIGGERS ON A RISING OR FALLING INPUT SIGNAL EDGE

FIELD OF THE INVENTION

The present invention relates to timing circuits for integrated circuits and, more particularly, to timing circuits that can be configured to selectively trigger on a rising edge or falling edge of an input signal.

BACKGROUND

Some integrated circuits have a clock or timing circuit that generates a clock signal that is synchronized with an input clock signal. For example, the timing circuit may generate a pulse when triggered by the rising edge of the input clock signal. In some of these integrated circuits, the timing circuit is used because the integrated circuit requires clock pulses with a pulse width that is different from the pulse width of the input clock signal. Further, the integrated circuit may have different operational modes that require different clock pulses. For example, in one mode the integrated circuit may require pulses triggered on the rising edges of a first clock signal, while in another mode the integrated circuit may require pulses triggered on the falling edges of a second clock signal. That is, the triggering edge of the input clock signal may be different depending on the integrated circuit's operational mode.

FIG. 1 is a circuit diagram illustrative of a conventional timing circuit 10. Timing circuit 10 includes an inverting delay circuit 11, a P-channel field effect transistor (PFET) 12, two N-channel FETs (NFETs) 13 and 14 and an inverting latch circuit 16. PFET 12 is connected to pull-up the voltage at a node N15, whereas NFETs 13 and 14 form a pull-down NFET stack also connected to node N15. The gate of NFET 13 is connected to an input signal $CLK_{ir}$, whereas the gates of NFET 14 and PFET 12 are connected to receive input signal $CLK_{ir}$ via inverting delay circuit 11. Inverting delay circuit 11 provides a predetermined delay, designated herein as "δ". Latch circuit 16 has an input lead 15 connected to node N15 and generates an output signal $CLK_O$ at an output lead 17. Timing circuit 10 generates pulses synchronized with the rising edges of an input clock signal. In addition, the pulse width of the output pulses is determined by the duration of the delay provided by inverting delay circuit 11. Timing circuit 10 can generate signal $CLK_O$ with pulses having larger pulse widths than the input signal pulse widths, as described below.

FIG. 2 is a exemplary timing diagram illustrative of the operation of the timing circuit 10 (FIG. 1). Input signal $CLK_{ir}$ is represented by a waveform 21 in FIG. 2. In addition, the voltage at nodes N14 and N15 are represented by waveforms 22 and 23. Output signal $CLK_O$ is represented by a waveform 24. For clarity, the timing is illustrated in FIG. 2 with the propagation delays between circuit elements omitted.

Referring to FIGS. 1 and 2, timing circuit 10 operates as follows. Input signal $CLK_{ir}$ is received by inverting delay circuit 11, which outputs a signal at node N14 equivalent to an inverted and delayed version of input signal $CLK_{ir}$. Thus, a rising edge $21_1$ of input signal $CLK_{ir}$ causes a falling edge $22_1$ in waveform 22 after a delay of about δ. Likewise, a falling edge $21_2$ in waveform 21 causes a rising edge $22_2$ in waveform 22 after a delay of about δ. As shown in FIG. 2, in this example the delay δ provided by inverting delay circuit 11 is greater than the pulse width of the pulses of input signal $CLK_{ir}$.

Assuming initially that input signal $CLK_{ir}$ is at a logic low level while the voltage of nodes N14 and N15 are at logic high levels, output signal $CLK_O$ is at a logic high level, NFET 14 is turned on, and PFET 12 and NFET 13 are turned off. The logic levels of node N15 and output signal $CLK_O$ are maintained by inverting latch circuit 16. Thus, rising edge $21_1$ turns on NFET 13, which allows NFETs 13 and 14 to pull down the voltage at node N15 as indicated by falling edge $23_1$ of waveform 23. The falling edge $23_1$ in turn causes inverting latch circuit 16 to transition output signal $CLK_O$ to a logic high level, as indicated by rising edge $24_1$.

Subsequently, falling edge $21_2$ of waveform 21 occurs, thereby turning off NFET 13. However, because NFET 14 is already turned off, falling edge $21_2$ does not cause a transition in the voltage at node N15. Thus, output signal $CLK_O$ remains at a logic high level. However, when rising edge $21_1$ of input signal $CLK_{ir}$ propagates through delay circuit 11 after delay δ to cause falling edge $22_1$ in waveform 22, PFET 12 is turned on while NFET 14 is turned off. As a result, the voltage at node N15 is pulled up, causing rising edge $23_2$ in waveform 23, which in turn is inverted by inverting latch circuit 16 to cause a falling edge $24_2$ in output signal $CLK_O$. Accordingly, output signal $CLK_O$ has a pulse with a pulse width equivalent to delay δ, which was triggered by a rising edge of input signal $CLK_{ir}$. After rising edge $22_2$ of waveform 22, the logic levels of waveforms 21–24 are returned to the previously described initial levels, awaiting for the next rising edge of input signal $CLK_{ir}$ to trigger another pulse in output signal $CLK_O$ with a pulse width of δ.

FIG. 3 is a circuit diagram illustrative of a second conventional timing circuit 30, which is configured to be triggerable on either the rising edge or falling edge of an input signal. Timing circuit 30 incorporates timing circuit 10, with the addition of a two-input multiplexer 31 and a noninverting delay circuit 33. An input lead 35 of multiplexer 31 is connected to receive input signal $CLK_{ir}$, whereas the other input lead 36 is connected to receive the output signal generated by noninverting delay circuit 33. Noninverting delay circuit 33 is connected to receive an input signal $CLK_{if}$. In particular, timing circuit 30 is configured to generate output pulses that are triggered on the falling edges of input signal $CLK_{if}$. Multiplexer 31 is connected to receive a mode signal M via a control lead 39 to selectively provide either input signal $CLK_{ir}$ or the output signal of noninverting delay circuit 33 to timing circuit 10. Mode signal M is generated by a mode control circuit (not shown).

Timing circuit 30 operates as follows. Mode signal M is used to configure timing circuit 30 into a first mode in which timing circuit 30 generates output pulses that are triggered by the rising edges of input signal $CLK_{ir}$, or into a second mode in which timing circuit 30 generates output pulses that are triggered by the rising edges of input signal $CLK_{if}$. When in the first mode, multiplexer 31 provides input signal $CLK_{ir}$ to timing circuit 10, which then generates output pulses as described above in conjunction with FIGS. 1 and 2. When in the second mode, multiplexer 31 provides a delayed version of input signal $CLK_{if}$ to timing circuit 10. The delay provided by noninverting delay circuit 33 is predetermined to delay input signal $CLK_{if}$ by a time equivalent to the pulse width of input signal $CLK_{if}$ so that, ideally, the rising edge of the signal generated by noninverting delay circuit 33 is coincident with the falling edge of input signal $CLK_{if}$.

However, noninverting delay circuit 33 adds a relatively large amount of area to timing circuit 30. In addition, timing circuit 10 (and thus, timing circuit 30) does not operate properly when the pulse width of the input signals are relatively large compared to the cycle time (i.e., the input signal has a large duty cycle). In particular, problems occur when the duty cycle of the input signal is large enough so that the rising edge of a pulse occurs before the falling edge of the previous pulse has propagated through delay circuit 11. More specifically, the first pulse will be generated properly, but subsequent pulses will be delayed from the rising edges of input signal $CLK_{ir}$, as described below.

FIG. 4 is a timing diagram illustrative of the operation of timing circuit 10 when the input signal has such a duty cycle. Input signal $CLK_{ir}$, the voltage at node N14, the voltage at node N15 and output signal $CLK_O$ are respectively represented by waveforms 41–44 in FIG. 4. Referring to FIGS. 3 and 4, assume initially that input signal $CLK_{ir}$ is at a logic low level while the voltage of nodes N14 and N15 are at logic high levels. As a result of these initial logic levels, output signal $CLK_O$ is at a logic low level, NFET 14 is turned on, and PFET 12 and NFET 13 are turned off. The logic levels of node N15 and output signal $CLK_O$ are maintained by inverting latch circuit 16.

Rising edge $41_1$ of waveform 41 turns on NFET 13, which allows NFETs 13 and 14 to pull down the voltage at node N15 as indicated by falling edge $43_1$ of waveform 43. The falling edge $43_1$ in turn causes inverting latch circuit 16 to transition output signal $CLK_O$ to a logic high level, as indicated by rising edge $44_1$.

Subsequently, due to the large duty cycle of input signal $CLK_{ir}$, falling edge $42_1$ of waveform 42 occurs before the falling edge $41_2$ of waveform 41. Thus, PFET 12 is turned on while NFET 14 is turned off. As a result, the voltage at node N15 is pulled up, causing a rising edge $43_2$ in waveform 43, which in turn is inverted by inverting latch circuit 16 to cause a falling edge $44_2$ in output signal $CLK_O$. Accordingly, the output pulse width of output signal $CLK_O$ is about equal to delay δ.

Subsequently, falling edge $41_2$ occurs in input signal $CLK_{ir}$, turning off NFET 13 and causing rising edge $42_2$ in waveform 42 after delay δ. In contrast to the first cycle of input signal $CLK_{ir}$, because NFET 14 is already turned off by the logic low level of the voltage at node N14, there is no transition in the logic level of the voltage at node N15. Rising edge $41_3$ occurs, turning on NFET 14 before rising edge $42_2$ occurs in the voltage at node N14. However, because NFET 14 is off, turning on NFET 13 does not cause a transition in the voltage at node N15. Then when rising edge $42_2$ does occur, the logic high level of the voltage at node N14 turns on NFET 14 and turns off PFET 12, thereby allowing NFETs 13 and 14 to pull down the voltage at node N15. Thus, falling edge $43_3$ occurs in the voltage at node N15, which is propagated through inverting latch 16 to cause rising edge $44_3$ in output signal $CLK_O$. As a result, the second pulse in output signal $CLK_O$ has a pulse width equal to the duration of the logic low period of input signal $CLK_{ir}$. In addition, this second pulse is delayed relative to the rising edge of the second pulse of input signal $CLK_{ir}$.

After the second pulse of output signal $CLK_O$, the logic levels of waveforms 41–44 leading into the third pulse of input signal $CLK_{ir}$, are returned to the previously described logic levels leading into the second pulse of input signal $CLK_{ir}$. Accordingly, the next rising edge of input signal $CLK_{ir}$ results in the third output pulse being generated in the same way as the second output pulse (i.e., delayed).

Accordingly, there is a need for a timing circuit that can be triggered on the rising or falling edges of an input signal to generate output pulses having a pulse width that is substantially independent of the pulse width and duty cycle of the input signal.

SUMMARY

In accordance with the present invention, a timing circuit is provided that can be selectively configured to generate output pulses in response to either the falling edges or the rising edges of an input signal. In addition, the timing circuit is configured to generate the output pulses substantially independently of the pulse width of the pulses of the input signal. In one embodiment, the timing circuit includes a multiplexer, an output pulse width controller (OPWC), a gating circuit (GC) and a latch circuit. The OPWC includes a delay circuit that can be configured to provide a predetermined delay δ that can be larger than the pulse width of the input signal pulses. The multiplexer is connected to receive a first input signal and an inverted version of a second input signal. The first input signal is used in a rising edge triggered mode, whereas the second input signal is used in a falling edge triggered mode. The multiplexer receives a mode signal to selectively output one of the input signals to the GC. The GC is also connected to receive the output signal from the OPWC. The OPWC is configured to cause, in conjunction with the selected signal from the multiplexer, the GC and latch circuit to generate output pulses having a predetermined pulse width equal to δ, triggered by the rising edges of the selected signal. Because the second input signal is inverted, during the second mode the output pulses are in effect triggered by the falling edges of the second input signal.

In another aspect of the present invention, the OPWC and the selected input signal cause the GC and latch circuit to generate output pulses substantially independently of the duty cycle of the selected signal from the multiplexer. More specifically, the duty cycle of the selected signal from the multiplexer can be significantly larger than can be properly processed by conventional timing circuits of this type. In accordance with this aspect of the present invention, the OPWC includes a second path to bypass the delay circuit to "set up" the GC before the next rising edge of the selected signal is received by the GC.

DETAILED DESCRIPTION

Figure 5:
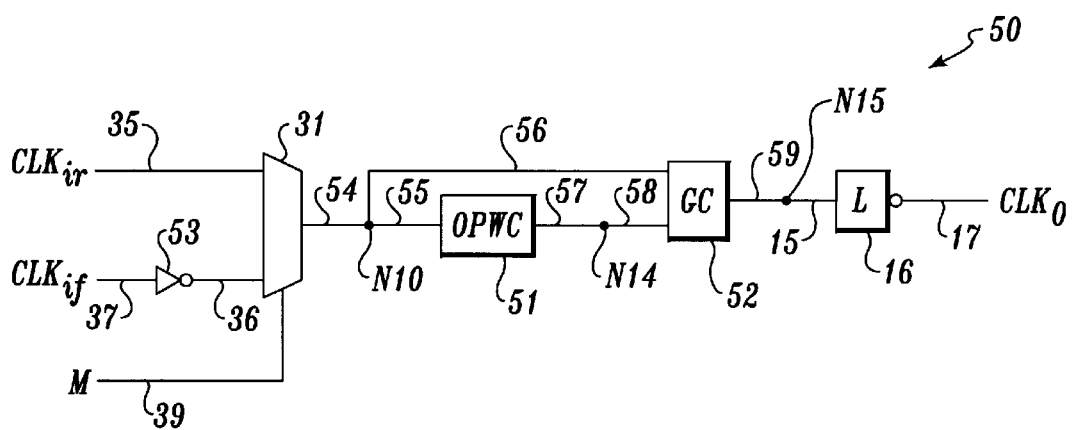
FIG. 5 is a functional block diagram illustrative of a timing circuit selectively configurable to trigger on a rising edge or a falling edge of an input signal, according to one embodiment of the present invention.

FIG. 5 is a functional block diagram illustrative of a timing circuit 50, according to one embodiment of the present invention. Timing circuit 50 is selectively configurable to trigger on a rising edge or a falling edge of an input signal and, moreover, to generate output pulses of a desired pulse width substantially independently of the pulse width and duty cycle of the input signal. This embodiment of timing circuit 50 includes an output pulse width controller (OPWC) 51, a gating circuit (GC) 52 and an inverter 53, as well as previously described multiplexer 31 and inverting latch circuit 16. For clarity, the same reference numbers are used between drawings to indicate elements having similar structure or function.

Timing circuit 50 is interconnected as follows. Multiplexer 31 is connected to receive input signal $CLK_{ir}$ through lead 35 and to receive an inverted version of input signal $CLK_{if}$ through inverter 53 via lead 36. Inverter 53 is connected to receive input signal $CLK_{if}$ through lead 37. These input clock signals are generated by a clock generator (not shown). Multiplexer 31 is also connected to receive mode signal M through lead 39 to select either input signals $CLK_{ir}$ and $CLK_{if}$ to propagate to an output lead 54 as a function of the logic level of mode signal M. Output lead 54 of multiplexer 31 is connected to an input lead 55 of OPWC 51 and to an input lead 56 of GC 52. OPWC 51 has an output lead 57 connected to another input lead 58 of GC 52 through node N14. GC 52 has an output lead 59 that is connected to input lead 15 of inverting latch circuit 16 through node N15. As in timing circuit 30, inverting latch circuit 16 generates output signal $CLK_O$ at output lead 17.

Timing circuit 50 operates as follows. In one embodiment, input signal $CLK_{ir}$ is intended to trigger timing circuit 50 with its rising edges, whereas input signal $CLK_{if}$ is intended to trigger timing circuit 50 with its falling edges. This embodiment can be advantageously used in a dynamic random access memory (DRAM) device to generate column address strobe (CAS) signals with a predetermined pulse width for different operational modes. In particular, in a first mode, the CAS pulses are required to be triggered on the rising edges of a CAS mode clock signal (i.e., $CLK_{ir}$), whereas in a second mode, the CAS pulses are required to be triggered on the falling edges of a second mode clock signal derived from the CAS mode clock signal (i.e., $CLK_{if}$).

Figure 3:
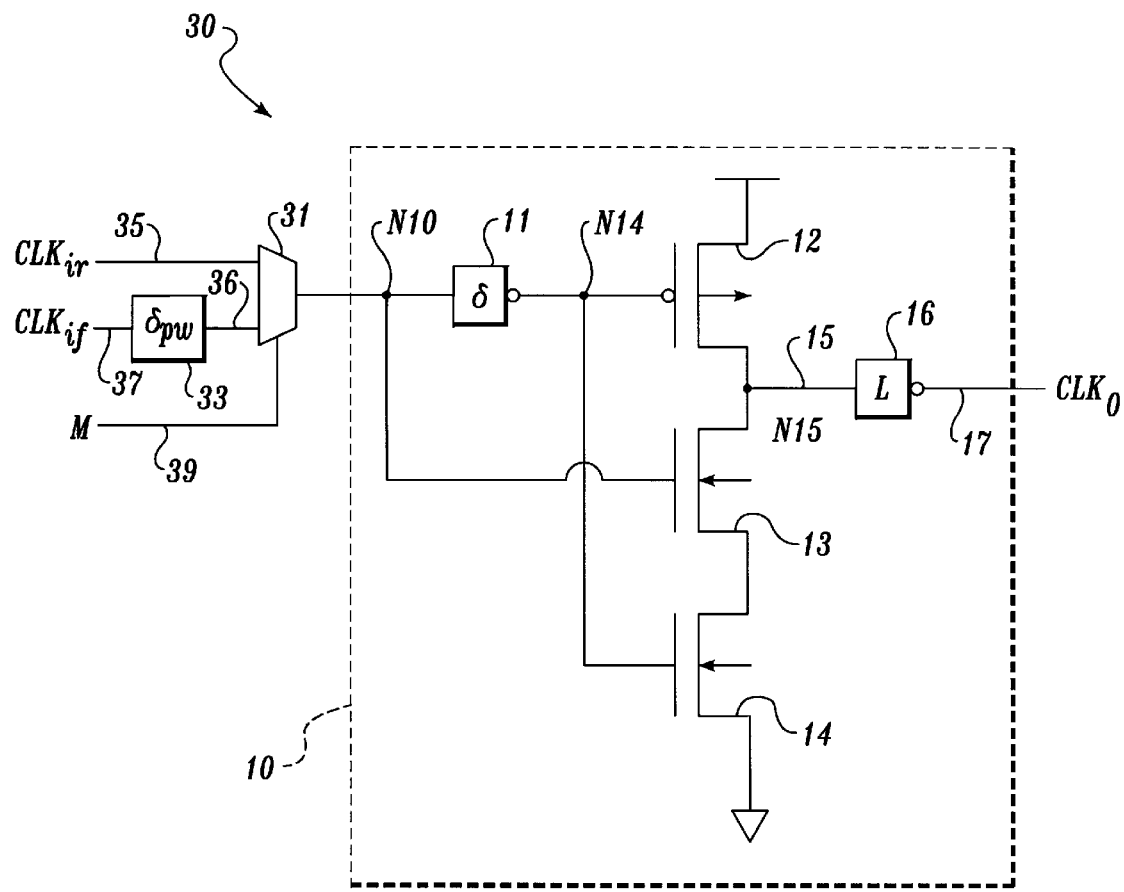
FIG. 3 is a circuit diagram illustrative of a second conventional triggerable timing circuit.

Inverter 53 inverts input signal $CLK_{if}$, thereby generating an intermediary signal having rising edges essentially coincident with the falling edges of input signal $CLK_{if}$. This intermediary signal is then used in generating output pulses that in effect are triggered on the falling edges of input signal $CLK_{if}$. Thus, timing circuit 50 advantageously uses a single inverter instead of the noninverting delay circuit as in conventional timing circuit 30 (FIG. 3).

Multiplexer 31 is configured to propagate either input signal $CLK_{ir}$ or the inverted version of input signal $CLK_{if}$ to output lead 54 as a function of the logic level of mode signal M. For example, in one embodiment, multiplexer 31 is configured to select input signal $CLK_{ir}$ when mode signal M is at a logic high level and to select inverted input signal $CLK_{if}$ when mode signal M is at a logic low level. Mode signal M is generated by a control circuit (not shown). For example, in a synchronous DRAM application, mode signal M may be used to configure the DRAM into a two-stage pipelined (CAS latency 2) mode or a three-stage pipelined (CAS latency 3) mode. The CAS latency 2 mode may use input signal $CLK_{if}$, whereas the CAS latency 3 mode may use input signal $CLK_{ir}$.

OPWC 51 receives the signal propagated by multiplexer 31 via input lead 55 and is configured to generate an output signal that, in conjunction with the output signal from multiplexer 31, causes GC 52 to generate "inverted" output pulses having a predetermined duration, triggered by rising edges of the "selected" input signal (i.e., the input signal propagated by multiplexer 31 in response to the logic level of mode signal M). Inverting latch circuit 16 then receives these "inverted" pulses and generates corresponding "positive" pulses in output signal $CLK_O$. Unlike conventional timing circuit 30 (FIG. 3), timing circuit 50 generates the output pulses with a duration or pulse width that is substantially independent of the pulse width and duty cycle of the selected input signal. More specifically, the input signals $CLK_{ir}$ and $CLK_{if}$ can have any pulse width and duty cycle provided the levels at nodes N10 and N14 remain at a particular logic level long enough to allow GC 52 to pull up or pull down the voltage at node N15 when GC 52 is causing a transition of the voltage at node N15. Basically, OPWC 51 allows the duty cycle of the signal selected by multiplexer 31 to be significantly larger than the maximum duty cycle that conventional timing circuit 30 can properly handle. Stated another way, the total predetermined delay provided by OPWC 51 can be larger than the logic low period of the input signal.

Figure 6:
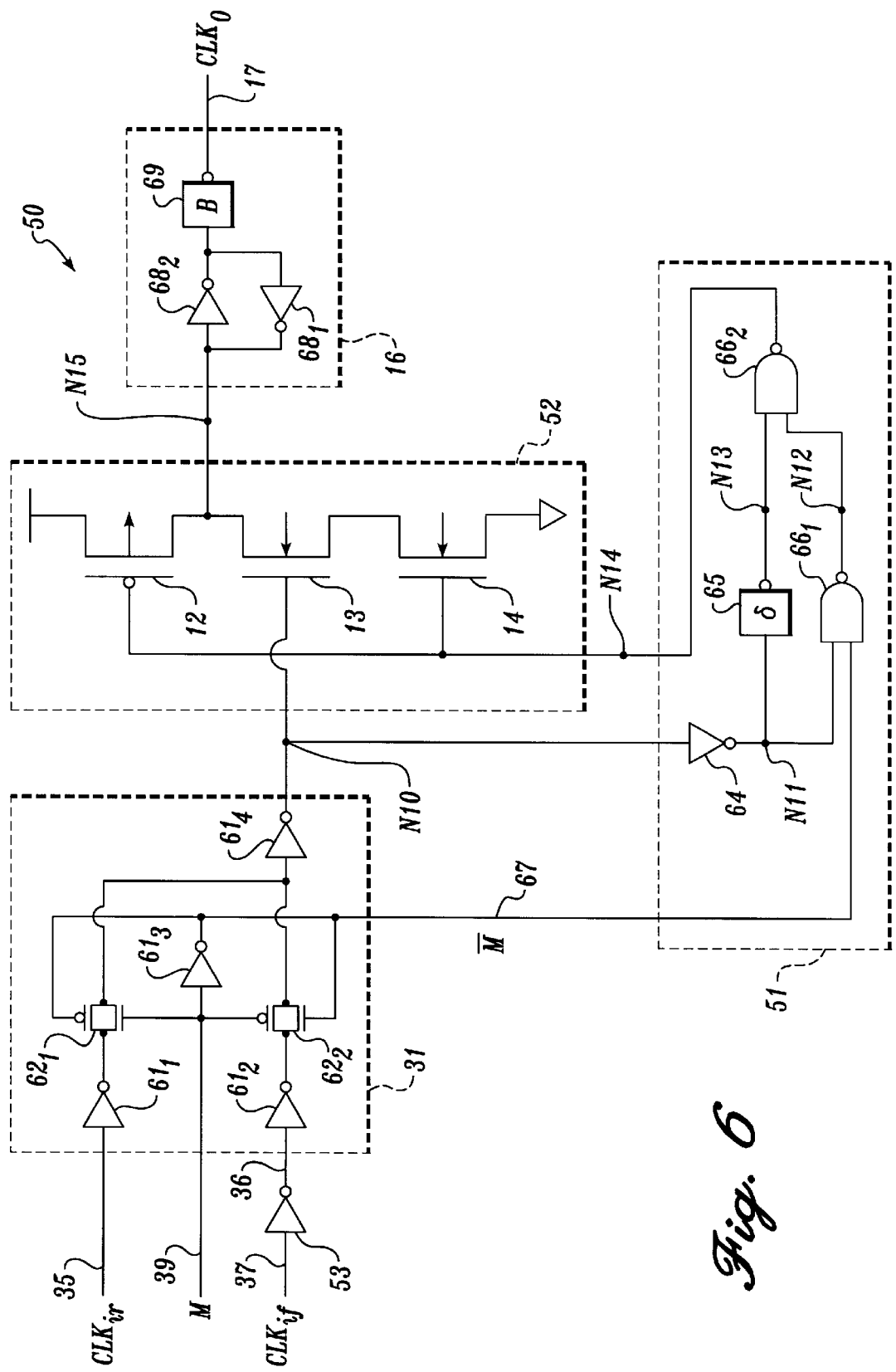
FIG. 6 is a schematic diagram illustrative of one implementation of the timing circuit of FIG. 5, according to one embodiment of the present invention.

FIG. 6 is a schematic diagram illustrative of an implementation of timing circuit 50 (FIG. 5), according to one embodiment of the present invention. In this embodiment, multiplexer 31 includes inverters $61_1$–$61_4$, and pass gates $62_1$ and $62_2$. GC 52 includes FETs 12–14 which are interconnected as in timing circuit 30 (FIG. 3) to each other and nodes N10 and N14. OPWC 51 includes an inverter 64, an inverting delay circuit 65, and two-input NAND gates $66_1$ and $66_2$. OPWC 51 also has an input lead 67 that is connected to receive an inverted version of mode signal M from the output lead of inverter $61_3$ of multiplexer 31. In this embodiment, inverting delay circuit 65 is implemented by cascading five inverters to provide a delay δ. Of course, in other embodiments, delay δ provided by inverting delay circuit 65 may be adjusting by changing the skewing and/or number of cascaded inverters, provided an odd number of inverters are used. Inverting latch circuit 16 includes inverters $68_1$ and $68_2$, and noninverting buffer 69. In this case, noninverting buffer 69 is implemented with an even number of cascaded inverters.

Multiplexer 31 is interconnected as follows. Inverter $61_3$ has an input lead connected to lead 39 to receive mode signal M. The output lead of inverter $61_3$ is connected in the conventional manner to opposite control terminals of pass gates $62_1$ and $62_2$. The other control terminals of pass gates $62_1$ and $62_2$ are connected to lead 39. Inverter $61_1$ has an input lead connected to input lead 35 and one signal terminal of pass gate $62_1$. The other signal terminal of pass gate $62_1$ is connected to the input lead of inverter $61_4$. Similarly, pass gate $62_2$ has one signal terminal connected to lead 36, with the other signal terminal connected to the input lead of inverter $61_4$. The output lead of inverter $61_4$ is connected to node N10.

OPWC 51 is interconnected as follows. Inverter 64 has an input lead connected to node N10 and has an output lead connected to input leads of inverting delay circuit 65 and NAND gate $66_1$ through a node N11. The other input lead of NAND gate $66_1$ is connected to input lead 67, whereas the output lead of NAND gate $66_1$ is connected to one input lead of NAND gate $66_2$ through a node N12. The other input lead of NAND gate $66_2$ is connected to the output lead of inverting delay circuit 65, whereas the output lead of NAND gate $66_2$ is connected to node N14. As is described further below, NAND gates $66_1$ and $66_2$ form a path that selectively bypasses inverting delay circuit 65 to "set up" GC 52 before the next rising edge of the selected signal from multiplexer 31.

Inverting latch circuit 16 is interconnected as follows. The output lead of inverter $68_1$ and the input lead of inverter $68_2$ are connected to node N15. The input lead and output lead of inverters $68_1$ and $68_2$, respectively, are connected to the input lead of buffer 69. The output lead of buffer 69 is connected to output lead 17.

Figure 1:
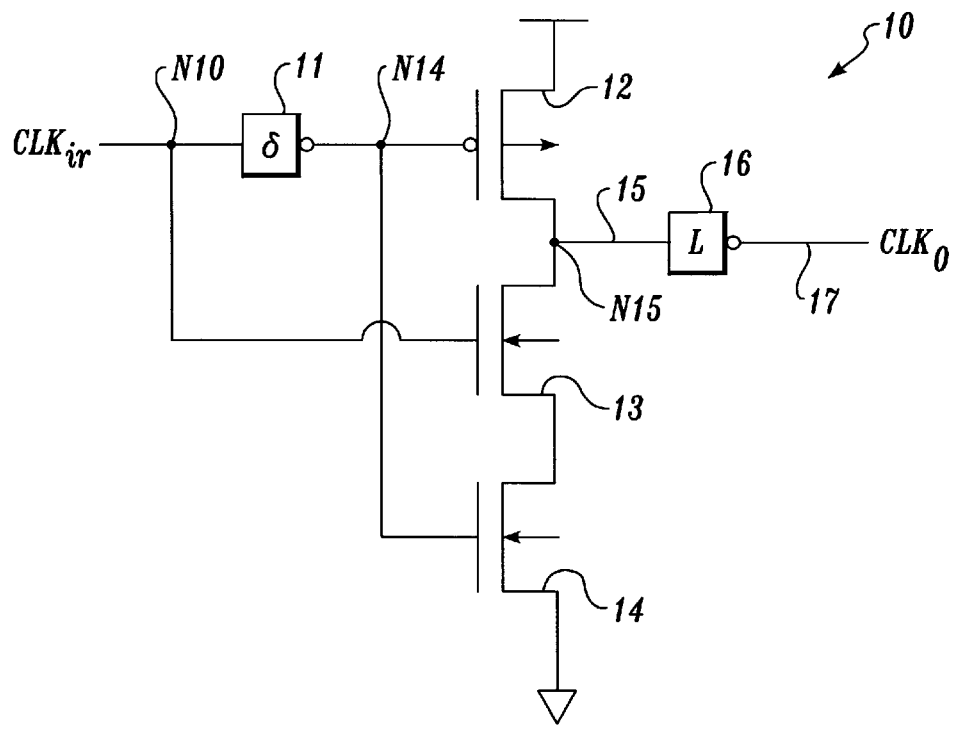
FIG. 1 is a circuit diagram illustrative of a conventional triggerable timing circuit.
Figure 2:
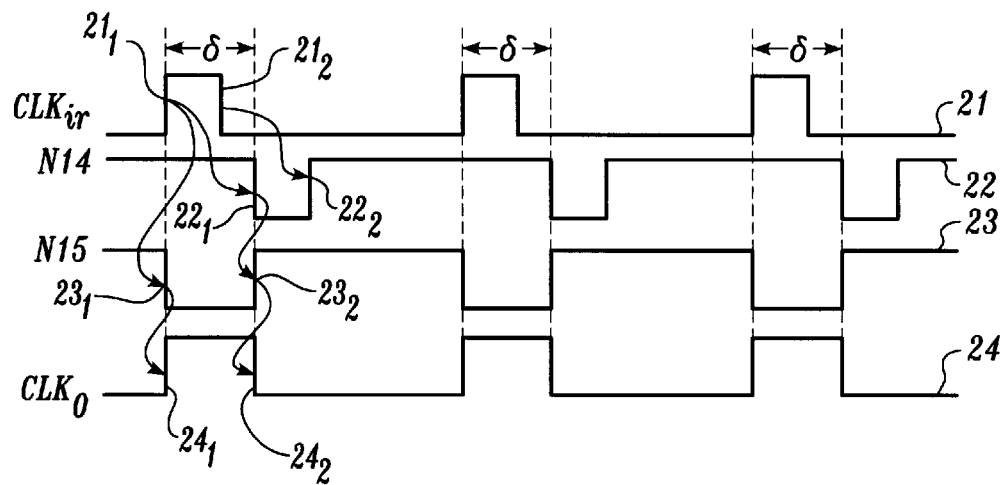
FIG. 2 is a exemplary timing diagram illustrative of the operation of the circuit of FIG. 1.

Mode signal M is generated by a control circuit (not shown) to configure timing circuit 50 into a rising edge trigger mode or a falling edge trigger mode. In this embodiment, when mode signal M is at a logic high level, pass gate $62_1$ is turned on while pass gate $62_2$ is turned off. As a result, multiplexer 31 propagates input signal $CLK_{ir}$ to node N10. In addition, the logic high level of mode signal M is inverted by inverter $61_3$ whereby a logic low level voltage is provided on input lead 67 of OPWC 51. Thus, while mode signal M is at a logic high level, NAND gate $66_1$ will output a logic high level signal to node N12 whatever the logic level of the voltage at node N11. This logic high level at node N12 causes NAND gate $66_2$ to function essentially as an inverter. Accordingly, OPWC 51 forms in effect a single inverting delay circuit, similar to inverting delay circuit 11 (FIG. 1). Thus, timing circuit 50 operates in the rising edge trigger mode in substantially the same manner as described above for timing circuit 10. The falling edge trigger mode is described further below in conjunction with FIGS. 7 and 8.

Figure 4:
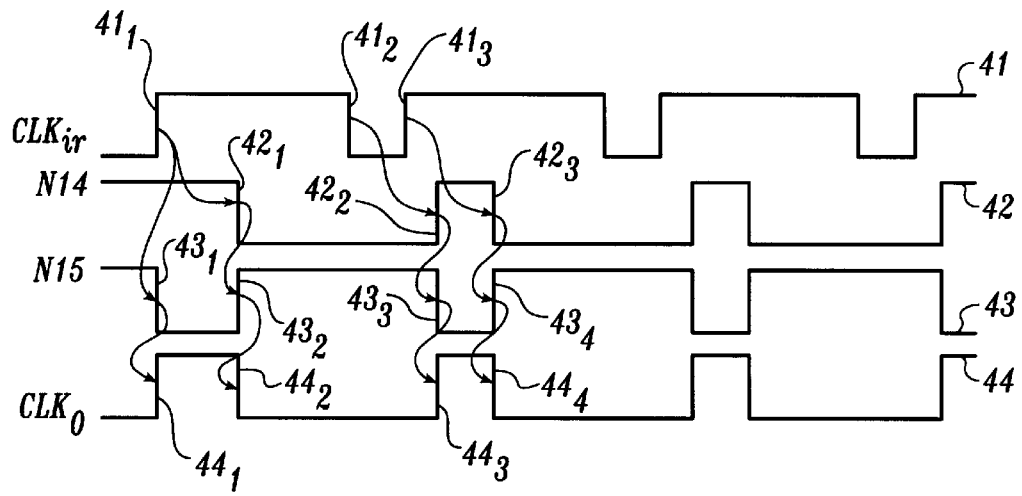
FIG. 4 is a timing diagram illustrative of the operation of a conventional triggerable timing circuit in receiving a large duty cycle input signal.
Figure 7:
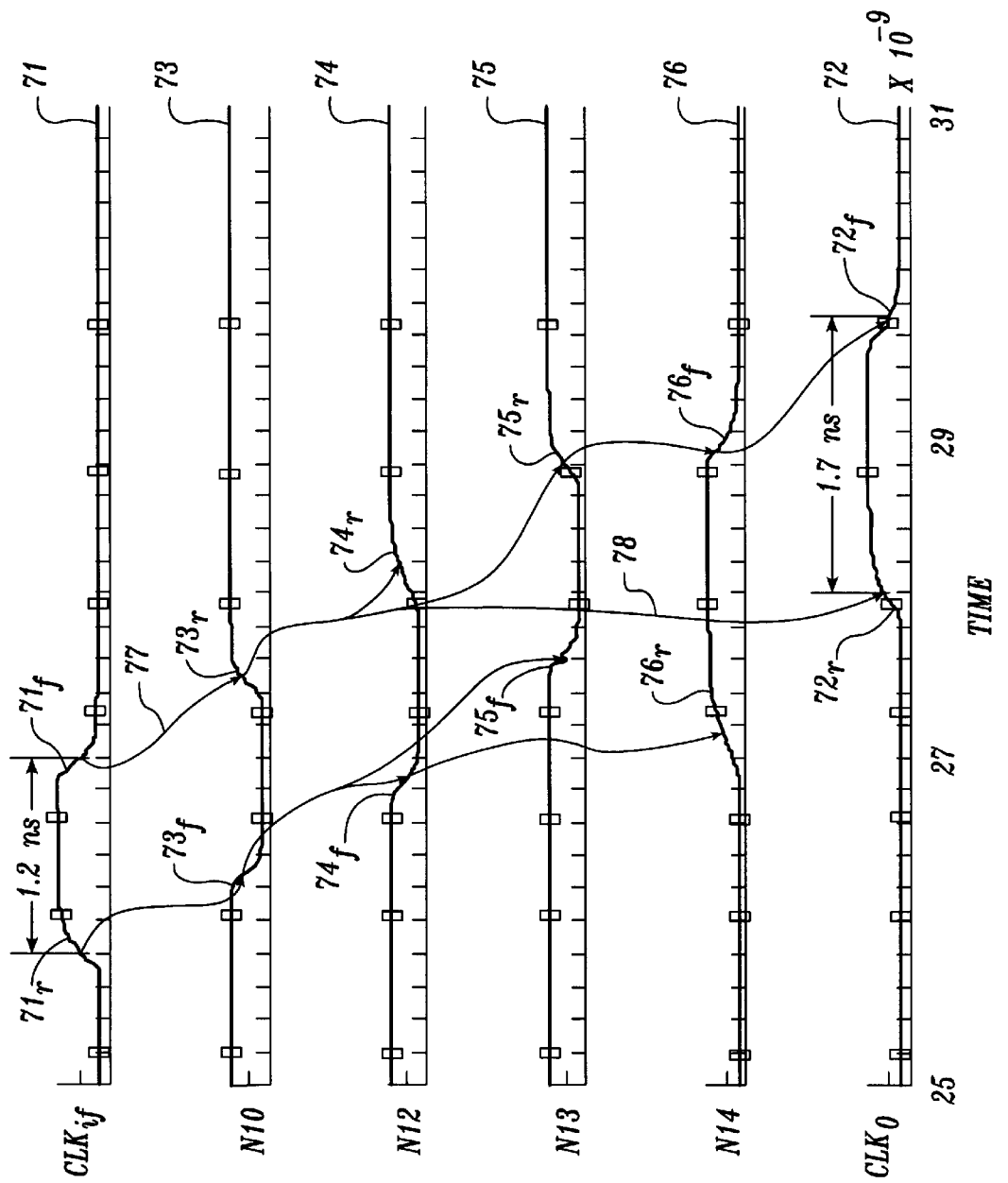
FIG. 7 is a timing diagram illustrative of the operation of the embodiment of FIG. 6.

FIG. 7 is a timing diagram illustrative of the operation of timing circuit 50 (FIG. 6) in generating output pulses in response to input signal $CLK_{if}$ (i.e., falling edge triggering). In this example, input signal $CLK_{if}$ has a relatively small duty cycle (i.e., about 12%) with a pulse width of about 1.2ns. Unlike the timing diagram of FIG. 4, the timing diagram of FIG. 7 illustrates the propagation delay incurred as signals are propagated through timing circuit 50. Signals $CLK_{if}$ and $CLK_O$ are represented by waveforms 71 and 72, whereas the voltage levels at nodes N10 and N12–N14 are represented by waveforms 73–76.

Referring to FIGS. 6 and 7, timing circuit 50 operates as follows. In this example, the aforementioned control circuit (not shown) generates mode signal M with a logic low level. Consequently, pass gate $62_1$ is turned off while pass gate $62_2$ is turned on, thereby selecting input signal $CLK_{if}$ to propagate to node N10. In addition, mode signal M is inverted by inverter $61_3$, causing NAND gate $66_1$ to receive a logic high level at one of its input leads. As a result, NAND gate $66_1$ functions essentially as an inverter.

Input signal $CLK_{if}$, the voltage at node N14, and output signal $CLK_O$ are initially at logic low levels while the voltages at nodes N10, N12 and N13 are at logic high levels. Input signal $CLK_{if}$ is then propagated by inverters 53, $61_2$ and $61_4$ to node N10. Consequently, waveform 73 is a slightly delayed and inverted version of input signal $CLK_{if}$ and, thus, is equivalent to a signal having a large duty cycle in which the logic low level portion of each cycle is about 1.2ns in duration (i.e., similar to waveform 41 in FIG. 4). As a result, merely replacing pulse width delay circuit 33 (FIG. 3) with an inverter in timing circuit 30 will generate output pulses without the desired timing. It will be appreciated by those skilled in the art that in the falling edge trigger mode, cycles start with the rising edges of waveform 73, which correspond to the falling edges of waveform 71. Thus, GC 52 must be "set up" before the rising edges of waveform 73.

Waveform 74 is a delayed version of waveform 73 because the voltage of node N10 is propagated to node N12 through what are essentially two inverters (i.e., inverter 64 and NAND gate $66_1$). Likewise, waveform 75 is also a delayed version of waveform 73 because the voltage at node N10 is inverted twice (by inverter 64 and inverting delay circuit 65), incurring the delay $\delta$ provided by inverting delay circuit 65. Consequently, the total delay through OPWC 51 is the sum of the delays through inverter 64, inverting delay circuit 65 and NAND gate $66_2$ (about 1.7ns in this example).

Thus, a rising edge $71_r$ of input signal $CLK_{if}$ is propagated by inverters 53, $61_2$ and $61_4$, causing a falling edge $73_f$ in the voltage at node N10. In turn, falling edge $73_f$ is twice inverted (by inverter 64 and NAND gate $66_1$), causing a falling edge $74_f$ in waveform 74. In addition, falling edge $73_f$ is twice inverted in propagating through inverter 64 and inverting delay circuit 65 to node N13, resulting in falling edge $75_f$ in waveform 75. Delay circuit 65 causes falling edge $75_f$ to be delayed relative to falling edge $73_f$ by about $\delta$ plus the delay through inverter 64 (about 1.3ns in this example). Thus, waveform 75 has an "inverted" pulse width that is about equal to the pulse width of a pulse in input signal $CLK_{if}$ (assuming the devices are not skewed).

Falling edge $74_f$ is propagated through NAND gate $66_2$ to node N14, causing rising edge $76_r$ in waveform 76. Falling edge $75_f$ causes no transition in the output signal of NAND gate $66_2$ because the output signal of NAND gate $66_2$ is already at a logic high level. At this point, the voltage at both input leads of NAND gate $66_2$ are at logic low levels. In this example, rising edge $74_r$ then occurs to cause a logic high level at node N12. However, because the voltage at node N13 is still at a logic low level, NAND gate $66_2$ does not transition the voltage at node N14. Finally, when rising edge $75_r$ occurs in the voltage at node N13, NAND gate $66_2$ causes the voltage at node N14 to transition to a logic low level, as indicated by falling edge $76_f$ in waveform 76.

With the waveforms at nodes N10 and N14 now described (i.e., the input signals to GC 52), output signal $CLK_O$ can be easily determined. In this example, the voltages at nodes N14 and N10 are at a logic low level and logic high level, respectively. Thus, PFET 12 is on and NFET 14 is off, thereby precharging node N15, with latch circuit 16 maintaining the logic level of output signal $CLK_O$ at a logic low level.

GC 52 is similar to a dynamic logic gate. For purposes of describing this embodiment, GC 52 can be considered as an inverter-like circuit, with the voltage at node N10 serving as the inverter input signal and the voltage at node N14 serving as a pull-down enable signal. Consequently, GC 52 will pull up the voltage at node N15 when the voltage at node N14 is at a logic low level because this logic low level will turn on PFET 12 while turning off NFET 14. In contrast, GC 52 will pull down the voltage at node N15 only when the voltages at both nodes N10 and N14 are at logic high levels, thereby turning on NFETs 13 and 14 while turning off PFET 12. Because the voltage at node N15 is inverted again by inverting latch circuit 16, output signal $CLK_O$ transitions to a logic low level whenever the voltage at node N14 transitions to a logic low level, and transitions to a logic high level whenever the voltages at nodes N10 and N14 are both at logic high levels.

Further, as can be seen in FIG. 7, rising edge $76_r$ at node N14 is timed to occur before rising edge 73 at node N10 because rising edge $76_r$ is caused by previously occurring falling edge $74_f$, which in turn was caused by previously occurring falling edge $73_r$, As a result of this timing, the voltage at node N14 is at a logic high level before falling edge $71_f$ in input signal $CLK_{if}$ occurs, thereby allowing rising edge $73_r$ in the voltage at node N10 (triggered by falling edge $71_f$) to trigger rising edge $72_r$ in output signal $CLK_O$ as indicated by arrow 78.

In addition to triggering rising edge $72_r$ in output signal $CLK_O$, rising edge $73_r$ also causes rising edge $75_r$ in the voltage at node N13 after the delay incurred through inverter 64 and inverting delay circuit 65. Rising edge $75_r$ in turn causes falling edge $76_f$ in the voltage at node N14. As described above, a falling edge in the voltage at node N14 causes a falling edge in output signal $CLK_O$. Thus, falling edge $71_f$ in input signal $CLK_{if}$ also triggers falling edge $72_f$ in output signal $CLK_O$, with a delay relative to rising edge $72_r$ of about δ from inverting delay circuit 65 and any skewing in inverting latch circuit 16. Thus, falling edge $71_f$ in input signal $CLK_{if}$ triggers an output pulse with a pulse width about equal to the delay provided by inverting delay circuit 65. By replacing inverter 64 with an inverting delay circuit, the output pulses may have a pulse width of up to two times the pulse width of input signal pulses. If the delay were made longer than twice the input pulse width, falling edge $75_f$ in the voltage at node N13 would occur after rising edge $74_r$ in the voltage at node N12, thereby undesirably causing a transition in the output voltage of NAND gate $66_2$. However, timing circuit 50 can be modified to generate output pulses with pulse widths longer than twice the input signal pulse width, as described below in conjunction with FIG. 8.

Timing circuit 50 avoids the problem that conventional timing circuit 30 (FIG. 3) has with input signals that have large duty cycles (i.e., a short logic low period in their cycle period) as follows. GC 52 is considered to be "set up" when the voltages at nodes N10 and N14 are respectively at logic low and logic high levels. That is, before a rising edge of the selected signal from multiplexer 31, GC 52 must be "set up" with a logic high voltage level at node N14 and a logic low voltage level at node N10. As previously described in conjunction with FIG. 4, timing circuit 30 does not operate properly when the voltage at node N10 transitions to a logic high level before its previous logic low transition has propagated through the inverting delay circuit to node N14. Timing circuit 50 advantageously operates to help ensure that the voltage at node N14 is at a logic high level before the voltage at node N10 transitions to a logic high level (i.e., resetting GC 52) by bypassing the inverting delay circuit 65 through NAND gates $66_1$ and $66_2$ to propagate and invert falling edge $73_f$ to node N14. As a result, GC 52 is "set up" before rising edge $73_r$ propagates to node N10. The pulse width and duty cycle of input signal $CLK_{if}$ is limited by the amount of time needed by GC 52 to pull down the voltage at node N15 and cause a rising edge in output signal $CLK_O$. More specifically, the pulse width and duty cycle of input signal $CLK_{if}$ are set so as to ensure that the overlap of the logic high pulses at nodes N10 and N14 allow NFETs 13 and 14 to pull down the voltage at node N115. conversely, input signal $CLK_{if}$ must have a logic low duration sufficient to allow PFET 12 to pull up the voltage at node N15.

In light of this disclosure, those skilled in the art will appreciated that timing circuit 50 is advantageously used when input signals $CLK_{ir}$ and $CLK_{if}$ have relatively narrow pulses (i.e., relatively small duty cycle). Thus, when input signal $CLK_{if}$ is inverted so as to achieve falling edge triggering, the large duty cycle of the inverted signal is handled using the above-described bypass path scheme. For applications in which input signals $CLK_{if}$ and $CLK_{ir}$ both cause large duty cycle signals at node N10, timing circuit 50 can be modified by and disconnecting lead 67 from MUX 31 and hardwiring lead 67 to a logic high source. Also, inverter $61_1$ must be deleted so that the bypass path is activated during the rising edge trigger mode. Expanding this concept further, by disconnecting lead 67 from MUX 31 to receive noninverted mode signal M directly, circuit 50 can be adapted for use with input signals $CLK_{ir}$ and $CLK_{if}$ having large and small duty cycles, respectively.

Figure 8:
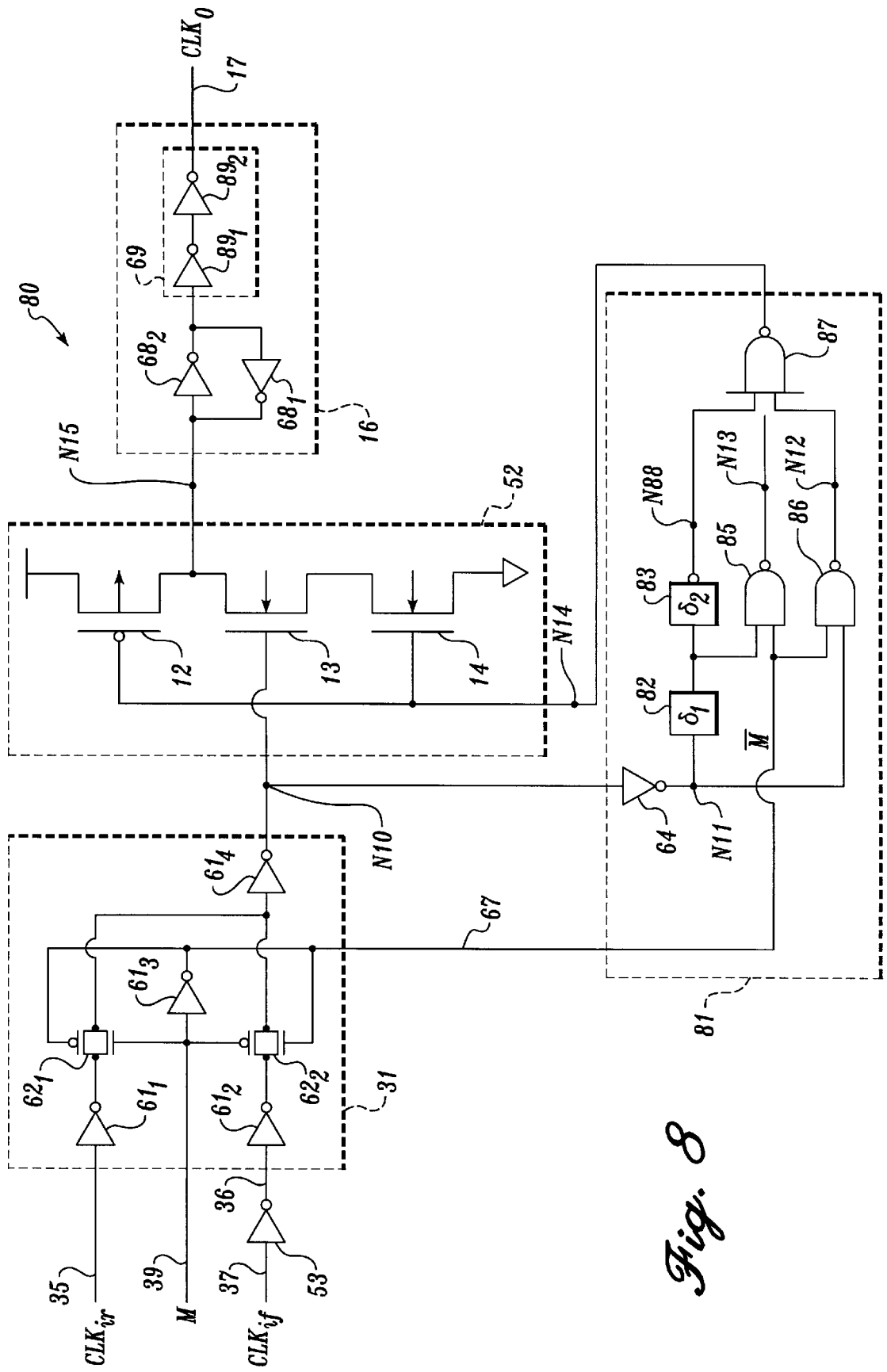
FIG. 8 is a schematic diagram illustrative of a timing circuit according to another embodiment of the present invention.

FIG. 8 is a schematic diagram illustrative of a timing circuit 80, according to another embodiment of the present invention. Timing circuit 80 is similar to timing circuit 50 (FIG. 6) except that timing circuit 80 is configured to generate output pulses with a pulse width greater than twice the pulse width of the input signal pulses. In particular, timing circuit 80 is the same as timing circuit 50, except that an OPWC 81 replaces OPWC 51 in timing circuit 50. As well as inverter 64, OPWC 81 includes a noninverting delay circuit 82, an inverting delay circuit 83, and three NAND gates 85–87. In this embodiment, noninverting delay circuit 82 is implemented with six cascaded inverters, providing a delay designated herein as $δ_1$. Similarly, inverting delay circuit 83 is implemented with five cascaded inverters, providing a delay designated herein as $δ_2$. Delays $δ_1$ and $δ_2$ are predetermined to each be less than the pulse width of the input signal pulses to achieve an output pulse width of about twice the pulse width of the input signal pulses. By replacing inverter 64 with an inverting delay circuit, the output pulse width may be up to three times the pulse width of the input pulses. In addition, one implementation of buffer 69 is also shown in FIG. 8. In this embodiment, buffer 69 is implemented with two cascaded inverters $89_1$ and $89_2$.

OPWC 81 is interconnected as follows. Input lead 67 is connected to one input lead each of two-input NAND gates 85 and 86. The output lead of inverter 64 is connected to the input lead of noninverting delay circuit 82 and the other input lead of NAND gate 86. The output lead of noninverting delay circuit 82 is connected to the input lead of inverting delay circuit 83 and the other input lead of NAND gate 85. The output leads of inverting delay circuit 83 and NAND gates 85 and 86 are connected to the input leads of three-input NAND gate 87 through nodes N88, N13 and N12, respectively. The output lead of NAND gate 87 is connected to node N14. NAND gates 85–87 form a bypass path for selectively bypassing delay circuits 82 and 83.

Figure 9:
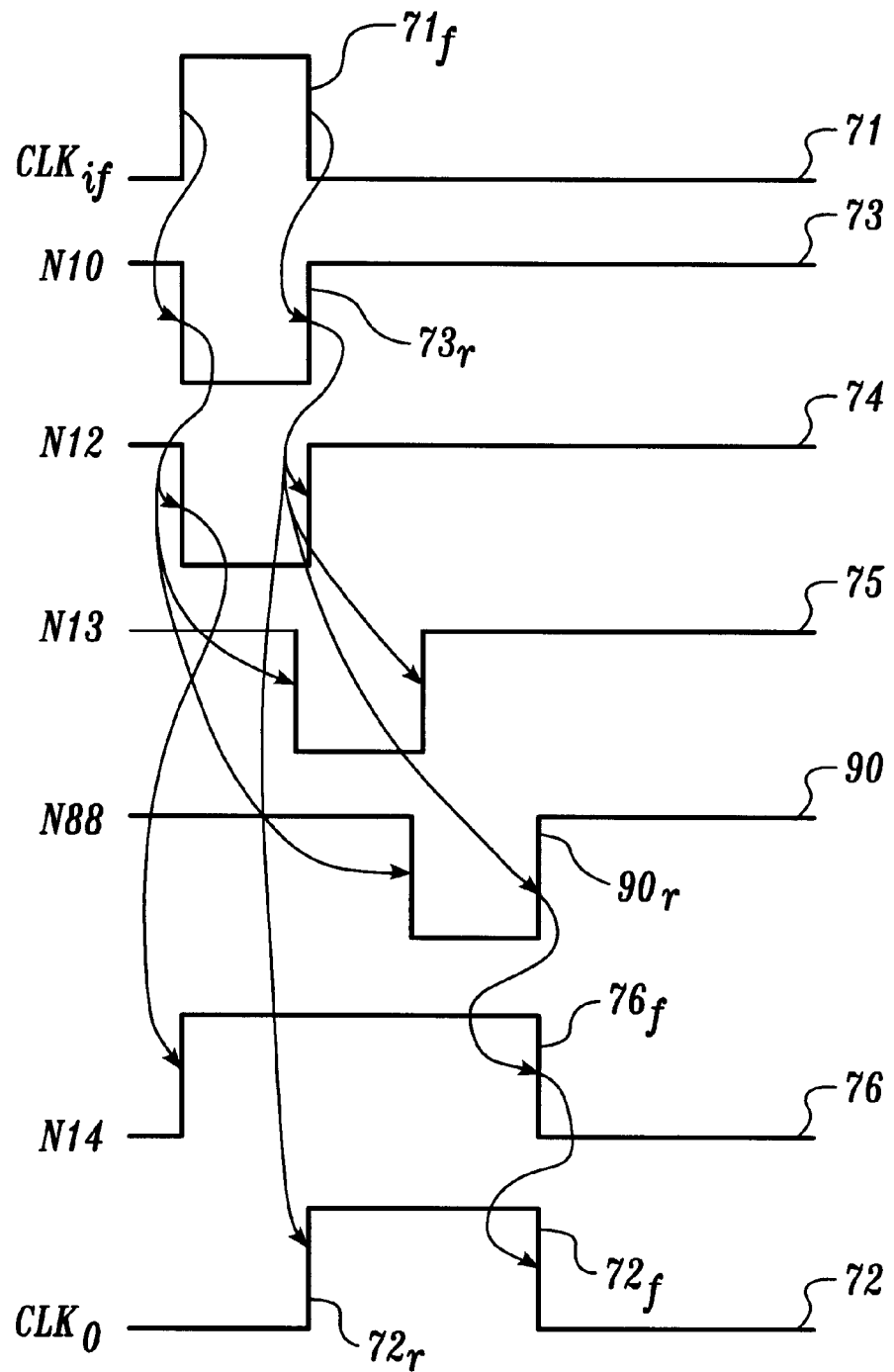
FIG. 9 is a timing diagram illustrative of the operation of the embodiment of FIG. 8.

FIG. 9 is a timing diagram illustrative of the operation of timing circuit 80 (FIG. 8). Basically, the timing diagram of FIG. 9 is the same as the timing diagram of FIG. 7, except that the propagation delays (except those through delay circuit 82 and 83) have been omitted, a waveform 90 is added representing the level of the voltage at node N88, and falling edge $76_f$ of the voltage at node N14 is triggered by a rising edge $90_r$ of the voltage at node N88 instead of rising edge $75_r$ of the voltage at node N13. The triggering of falling edge $76_f$ by rising edge $75_r$ is described further below.

Referring to FIGS. 8 and 9, timing circuit 80 operates as follows. When mode signal M is at a logic high level, multiplexer 31 selects input signal $CLK_{ir}$ to propagate to node N10. In addition, the logic high level of mode signal M causes inverter $61_3$ to generate a logic low level at input lead 67, thereby causing NAND gates 85 and 86 to provide logic high level signals to three-input NAND gate 87. Consequently, NAND gate 87 functions as an inverter while mode signal M is at a logic high level. As a result, OPWC 81 in effect functions like inverting delay circuit 11 (FIG. 1) causing timing circuit 80 to operate in substantially the same manner as timing circuit 10 (FIG. 1).

When mode signal M is at a logic low level, multiplexer 31 selects the inverted version (via inverter 53) of input signal $CLK_{if}$ to propagate to node N10. Thus, the waveform of the voltage at node N10 is substantially the same as waveform 73 (described in conjunction with FIG. 7). In addition, inverter 61₃ inverts mode signal M so that the voltage level at input lead 67 is at a logic high level, thereby causing NAND gates 85 and 86 to function as inverters. Thus, the waveforms of the voltage at nodes N12 and N13 are substantially the same as waveforms 74 and 75 (described in conjunction with FIG. 7). More particularly, waveform 75 is a delayed version of waveform 74, delayed by about $\delta_1$. Inverting delay circuit 83 similarly causes waveform 90 to be a delayed version of waveform 75, with a delay of about $\delta_2$. The voltage at node N14 is generated by NAND gate 87, which will output a logic low level only when the voltages at nodes N12, N13 and N88 are all at logic high levels. As shown in FIG. 9, all three of these voltage levels are high in a cycle only after rising edge $90_r$ occurs. Thus, rising edge $90_r$ triggers falling edge $76_f$ in the voltage at node N14, thereby extending the pulse width of the pulse generated at node N14 by a duration of about $\delta_2$ compared to the pulse width of the voltage at node N14 in FIG. 7. It will be appreciated that NAND gates 85–87 bypass delay circuits 82 and 83 in propagating, inverting and maintaining logic low levels of the voltage signal at node N10 to node N14 to "set up" GC 52 before the next rising of the voltage signal at node N10 occurs.

As described above in conjunction with FIG. 7, GC 52 is configured to pull up the voltage of output signal $CLK_O$ only when the voltages at nodes N10 and N14 are both at logic high levels. Thus, falling edge $71_f$ of input signal $CLK_{if}$ causes a rising edge $73_r$ in the voltage at node N10 while the voltage at node N14 is still at a logic high level. As a result, the voltages at nodes N10 and N14 are both at logic high levels, causing GC 52 to pull up the voltage of output signal $CLK_O$, as indicated by rising edge $72_r$.

GC 52 is also configured to pull down the voltage of the output signal $CLK_O$ whenever the voltage at node N14 is at a logic low level. Thus, after the start of the cycle, the voltage at node N14 transitions to a logic low level (i.e., falling edge $76_f$) when triggered by rising edge $90_r$ of the voltage at node N88. Waveform 90 is a delayed version of waveform 73. This delay is incurred as rising edge $73_r$ propagates through delay circuits 82 and 83 and, thus, is about equal to $\delta_1$ plus 82. Thus, after rising edge $73_r$ occurs (triggering rising edge $72_r$ of the output pulse), rising edge $90_r$ then occurs after a delay of about $\delta_1$ plus $\delta_2$, thereby triggering falling edge $72_f$ of the voltage at node N14. Falling edge $76_f$ triggers GC 52 to pull down the voltage of output signal $CLK_O$, as indicated by falling edge $72_f$. Accordingly, the pulse width of the output pulse is about equal to $\delta_1$ plus $\delta_2$. After falling edge $72_f$ occurs, the voltage levels of waveforms 71–76 and 90 are returned to the same levels as at the beginning of the cycle. Thus, timing circuit 90 will operate in the same manner during the next cycle.

This concept can be further expanded to increase the pulse width of the output pulses even further by adding a noninverting delay circuit and corresponding NAND gate to OPWC 81. Each additional subcircuit allows the resulting timing circuit to increase the pulse width of the output pulses by an amount about equal to the input signal pulse width. The NAND gate driving node N14 would have to have an additional input lead for each additional subcircuit. This NAND gate structure allows falling edges in the voltage signal at node N10 to be propagated and inverted to node N14 to reset GC 52 and maintain GC 52 in the reset condition before the next rising edge of the voltage signal at node N10 occurs.

The embodiments of the clock circuit described above are illustrative of the principles of the present invention and are not intended to limit the invention to the particular embodiments described. For example, in light of the present disclosure, those skilled in the art of integrated circuit design can devise other implementations of the gating circuit without undue experimentation. In addition, those skilled in the art of logic circuits can implement equivalent logic for the OPWC adapted for use with a mode signal having a polarity that is different from the mode signal described, or with more than two mode signals and two input signals. For example, the "reverse" circuit can be implemented for active low input pulses by using NOR gates instead of NAND gates and by using N-channel precharge devices and P-channel evaluation devices in GC 52. Accordingly, while the preferred embodiment of the invention has been illustrated and described, it will be appreciated that various changes can be made therein without departing from the spirit and scope of the invention.

I claim:

1. A timing circuit for generating an output pulse triggered by an input pulse of an input signal, the input pulse having a leading edge and a trailing edge, a first signal or a second signal serving as the input signal, the timing circuit comprising:

a multiplexer having a first input lead coupled to receive the first signal and having a second input lead coupled to receive the second signal and having a third input lead coupled to receive a mode signal, wherein the multiplexer is configured to output a selected signal dependent on the first or second signal as a function of a logic level of the mode signal;

a first node coupled to receive the selected signal outputted by the multiplexer;

a second node;

a logic circuit coupled to the third input lead and the first and second nodes, wherein the logic circuit is configured to cause a level at the second node to have a first logic level in response to the leading edge of the input pulse and the logic level of the mode signal and to transition to a second logic level after a predetermined delay period started in response to the trailing edge of the input pulse and the logic level of the mode signal; and a gating circuit having a first input lead, a second input lead and an output lead, the first and second input leads of the gating circuit being respectively coupled to the first and second nodes, wherein the gating circuit is configured to change a voltage level at the output lead of the gating circuit as a function of the logic levels at the first and second nodes; and a latch circuit coupled to the output lead of the gating circuit, the latch circuit being configured to generate the output signal as a function of the voltage level at the output lead of the gating circuit.

2. The timing circuit of claim 1 wherein the logic circuit is further configured to cause the predetermined delay period to be longer than a time period between the trailing edge of the input pulse and a leading edge of a next input pulse.

3. The timing circuit of claim 2 wherein the logic circuit comprises a delay circuit configured to output a signal that is a delayed version of a signal received by the delay circuit, the delay circuit providing a delay substantially equal to the predetermined delay period.

4. The timing circuit of claim 3 wherein the gating circuit is further configured to change the voltage level at the output lead of the gating circuit so that the output pulse has a pulse width that is longer than a pulse width of the input pulse.

5. The timing circuit of claim 3 wherein the multiplexer is further configured to cause the leading edge of the input pulse to be triggered by a trailing edge of an input pulse of the first signal.

6. The timing circuit of claim 3 wherein the multiplexer is a two-input multiplexer.

7. The timing circuit of claim 6 further comprising an inverter having an output lead coupled to the first input lead of the multiplexer and having an input lead coupled to receive a third signal, wherein a leading edge of the input signal corresponds to a trailing edge of the third signal.

8. The timing circuit of claim 7 wherein the logic circuit further comprises a logic gate having a first input lead coupled to the delay circuit and having an output lead coupled to the second node, wherein when the mode signal is at the first logic level, the logic circuit is configured to cause the logic gate to propagate one edge of the input pulse to the output lead of the logic gate through a logic path that includes the delay circuit and to propagate an opposite edge of the input pulse to the output lead of the logic gate through a logic path that does not include the delay circuit.

9. The timing circuit of claim 8 wherein when the mode signal is at the second logic level, the logic circuit is configured to propagate the input pulse from the first node to the second node through a logic path that includes the delay circuit and the logic gate.

10. The timing circuit of claim 9 wherein the logic circuit further comprises an inverter coupled to the first node and the delay circuit, a NAND gate coupled to the inverter of the logic circuit and the logic gate and also being coupled to receive an inverted version of the mode signal, the logic gate also being a NAND gate.

11. The timing circuit of claim 9 wherein the predetermined delay is greater than the pulse width of the input pulse and less than twice the pulse width of the input pulse.

12. The timing circuit of claim 9 wherein the delay circuit comprises a first delay subcircuit and a second delay subcircuit and wherein the logic circuit further comprises an inverter, a first NAND gate and a second NAND gate, the inverter of the logic circuit being coupled to the first node and the first delay subcircuit, the first delay subcircuit being coupled to the second delay subcircuit and to the first NAND gate, the second delay subcircuit being coupled to the logic gate, the first NAND gate being coupled to the logic gate and also being coupled to receive an inverted version of the mode signal, and the second NAND gate being coupled to the logic gate and also being coupled to receive the inverted version of the mode signal.

13. The timing circuit of claim 12 wherein the predetermined delay is greater than the pulse width of the input pulse and less than three times the pulse width of the input pulse.

14. The timing circuit of claim 12 wherein the second delay circuit is an inverting delay circuit and the logic circuit is a three-input NAND gate.

15. A method of generating an output pulse in response to an input pulse of an input signal, the method comprising:
  selectively entering a mode of a plurality of modes in response to a mode signal, the plurality of modes including a rising edge mode in which the output pulse is triggered by a rising edge of the input pulse, and including a falling edge mode in which the output pulse is triggered by a falling edge of the input pulse;
  providing at a first node a first node signal that is dependent on the input signal;
  providing at a second node a second node signal as a logic function of the first node signal, the output pulse being generated as a function of the logic levels of the first and second node signals;
  providing a logic circuit coupled to receive the mode signal and the first node signal, the logic circuit comprising:
    a delay circuit;
    a first logic gate having a first input lead coupled to the delay circuit and having an output lead coupled to the second node;
    an inverter coupled to the first node and the delay circuit;
    a second logic gate having a first input lead coupled to the inverter, an output lead coupled to the first logic gate, and a second input lead being coupled to receive an inverted version of the mode signal, and further wherein the logic circuit for:
      (a) generating a leading edge of the output pulse in response to a leading edge of the first node signal; and
      (b) generating a falling edge of the output pulse in response to the mode signal and the leading edge of the first node signal after a predetermined time delay, the predetermined time delay being selectively configured to be greater than a time period between a falling edge of the first node signal and a subsequent rising edge of the first node signal.

16. The method of claim 15 wherein:
  in the rising edge mode the first node signal is equivalent to the input signal; and
  in the falling edge mode the first node signal is equivalent to an inverted version of the input signal.

17. The method of claim 16 wherein:
  in the rising edge mode a rising edge and a falling edge of the second node signal are generated in a delay logic path that includes the delay circuit, the delay circuit providing a delay substantially equal to the predetermined delay; and
  in the falling edge mode, the rising edge of the second node signal is propagated in a bypass logic path that does not include the delay circuit and the falling edge of the second node signal is propagated in the delay logic path.

18. A structure for generating an output pulse in response to an input pulse of an input signal, the structure comprising:
  means for selectively entering a mode of a plurality of modes in response to a mode signal, the plurality of modes including a rising edge mode in which the output pulse is triggered by a rising edge of the input pulse, and including a falling edge mode in which the output pulse is triggered by a falling edge of the input pulse the plurality of modes including a rising edge mode and a falling edge mode;
  means for providing a first node signal at a first node the first node signal being a function of the input signal;
  means for providing at a second node a second node signal as a logic function of the first node signal, the output pulse being generated as a function of the logic levels of the first and second node signals;
  means for providing a logic circuit coupled to receive the mode signal and the first node signal, the logic circuit comprising:
    a delay circuit;
    a first logic gate having a first input lead coupled to the delay circuit and having an output lead coupled to the second node;
    an inverter coupled to the first node and the delay circuit;
    a second logic gate having a first input lead coupled to the inverter, an output lead coupled to the first logic gate, and a second input lead being coupled to receive an inverted version of the mode signal, and further wherein the logic circuit comprising:

(a) means for generating a leading edge of the output pulse in response to a leading edge of the first node signal; and (b) means for generating a falling edge of the output pulse in response to the mode signal and the leading edge of the first node signal after a predetermined time delay, the means for generating a falling edge being selectively configured to cause the predetermined time delay to be greater than a time period between a falling edge of the first node signal and a subsequent rising edge of the first node signal.

19. The structure of claim 18 wherein:

in the rising edge mode, the first node signal is equivalent to the input signal; and in the falling edge mode, the first node signal is equivalent to a complement of the input signal.

20. The structure of claim 19 wherein:

in the rising edge mode, the rising and falling edges of the second node signal are generated in a delay logic path that includes the delay circuit, the delay circuit providing a delay substantially equal to the predetermined delay; and in the falling edge mode, the rising edge of the second node signal is propagated in a bypass logic path that does not include the delay circuit and the falling edge of the second node signal is propagated in the delay logic path.

* * * * *